United States Patent
Honda et al.

(10) Patent No.: US 10,869,420 B2
(45) Date of Patent: Dec. 15, 2020

(54) METHOD FOR OPTIMIZING COMPONENT TYPE ALLOCATION AND APPARATUS FOR OPTIMIZING COMPONENT TYPE ALLOCATION

(71) Applicant: FUJI CORPORATION, Chiryu (JP)

(72) Inventors: Toshimitsu Honda, Okazaki (JP); Koichiro Sugimoto, Anjo (JP)

(73) Assignee: FUJI CORPORATION, Chiryu (JP)

( * ) Notice: Subject to any disclaimer, the term of this patent is extended or adjusted under 35 U.S.C. 154(b) by 151 days.

(21) Appl. No.: 15/929,107

(22) Filed: Feb. 25, 2019

(65) Prior Publication Data
US 2019/0191603 A1    Jun. 20, 2019

Related U.S. Application Data

(63) Continuation of application No. 15/555,781, filed as application No. PCT/JP2015/056627 on Mar. 6, 2015, now Pat. No. 10,278,319.

(51) Int. Cl.
| | | |
|---|---|---|
| H05K 13/04 | (2006.01) |
| G06Q 50/04 | (2012.01) |
| H05K 13/02 | (2006.01) |
| H05K 13/08 | (2006.01) |
| G06Q 10/04 | (2012.01) |

(52) U.S. Cl.
CPC ....... *H05K 13/0417* (2013.01); *G06Q 10/043* (2013.01); *G06Q 50/04* (2013.01); *H05K 13/0215* (2018.08); *H05K 13/0419* (2018.08); *H05K 13/085* (2018.08)

(58) Field of Classification Search
CPC combination set(s) only.
See application file for complete search history.

(56) References Cited

U.S. PATENT DOCUMENTS

| | | |
|---|---|---|
| 6,332,536 B2 | 12/2001 | Easton |
| 6,918,730 B2 | 7/2005 | Kawai |
| 7,083,082 B2 | 8/2006 | Byskov |
| 7,220,095 B2 | 5/2007 | Lyndaker |
| 9,181,459 B2 | 11/2015 | Rome |

FOREIGN PATENT DOCUMENTS

JP    2009-130337 A    6/2009

OTHER PUBLICATIONS

International Search Report dated Jun. 2, 2015, in PCT/JP2015/056627 filed Mar. 6, 2015.

*Primary Examiner* — Carlos Ortiz Rodriguez
(74) *Attorney, Agent, or Firm* — Oblon, McClelland, Maier & Neustadt, L.L.P.

(57) ABSTRACT

A method for optimizing component type allocation in which multiple component types of components are optimally allocated to an automatic feeder device which automatically loads the component storage tape and a manual feeder device which does not automatically load when the automatic feeder device and the manual feeder device are installed installation positions on a common pallet, the method including: a workability evaluating step of evaluating a magnitude of labor in a splicing work for replenishing and connecting a new component storage tape in the manual feeder device for each of component types; and an automatic side allocating step of preferentially allocating component type having large labor in the splicing work to the automatic feeder device. Accordingly, the splicing work can be reduced by effectively using the automatic feeder device, and it can contribute to the improvement of the production efficiency of the board.

5 Claims, 4 Drawing Sheets

METHOD FOR OPTIMIZING COMPONENT TYPE ALLOCATION AND APPARATUS FOR OPTIMIZING COMPONENT TYPE ALLOCATION

CROSS REFERENCE TO RELATED APPLICATIONS

This application is a continuation application of U.S. application Ser. No. 15/555,781, filed Sep. 5, 2017, which is a national stage application of International Application No. PCT/JP2015/056627, filed Mar. 6, 2015, and the contents of each of the above are incorporated herein by reference.

TECHNICAL FIELD

The present application relates to a method for optimizing component type allocation and an apparatus for optimizing component type allocation for optimally allocating multiple component types to an automatic feeder device and a manual feeder device of which an object is improvement of production efficiency when the automatic feeder device and the manual feeder device are installed to multiple installation positions arrayed at a component mounting machine.

BACKGROUND ART

There are solder printing machines, component mounting machines, reflow machines, board inspection machines, and the like, as facilities for producing a board on which multiple components are mounted. It is common to constitute a board production line by connecting these facilities. Among them, the component mounting machine includes a board conveyance device, a component supply device, a component transfer device, and a control device. As a typical example of the component supply device, there is a feeder device which feeds a component storage tape storing components multiple component storage sections, respectively. In combination with the feeder device, a reel holding device which rotatably and interchangeably holds the component supply reel around which the component storage tape is wound is used.

Multiple feeder devices and the reel holding devices are disposed at multiple installation positions arrayed in the component mounting machine. The multiple component types of the component which is mounted on the board are disposed at multiple arrayed installation positions. At this time, the production efficiency of the board changes, depending on the arrangement order of the multiple component types. Therefore, a technology for simulating optimization of the component type arrangement has been developed in consideration of movement distance of a mounting head of the component transfer device or the like, and an example thereof is disclosed in PTL 1. In a device disposition determination method of PTL 1, a management device determines disposition of multiple feeder devices so that a mounting cycle time (takt time) required for producing one board is the shortest. At this time, differences in types of the multiple feeder devices, a condition of the component type that can be supplied, and the like are taken into consideration (see paragraphs 0026, 0027, and the like of PTL 1).

CITATION LIST

Patent Literature

PTL 1: JP-A-2009-130337

SUMMARY

Technical Problem

By the way, in the course of producing a board, when there is no component stored in a component storage tape in a manual feeder device of the related art, a splicing work for replenishing and connecting a new component storage tape is required. The splicing work is troublesome for the operator because it is laborious work and is one of the causes of lowering the production efficiency. As a countermeasure against this, an automatic feeder device (so-called auto loading feeder) has been developed which has an automatic loading function of automatically loading a component storage tape and thus greatly reducing the splicing work.

With respect to the recent development trend of the feeder device described above, the technology of PTL 1 does not take into consideration the difference in workability of the automatic feeder device and the manual feeder device. In other words, according to the technique of PTL 1, although the direct mounting cycle time for executing board production can be shortened, the splicing work cannot be reduced and in addition, the overall improvement in the comprehensive production efficiency including the splicing work time is difficult. From another viewpoint, establishment of a method of optimally allocating component type to the automatic feeder device and the manual feeder device so that the automatic feeder device having good workability and high convenience can be effectively used when the component storage tape is replenished.

The disclosure is made in view of the above problems of the background art and a problem to be solved is to provide a method for optimizing component type allocation and an apparatus for optimizing component type allocation which can effectively use the automatic feeder device, reduce the splicing work and contribute to improvement of a production efficiency of the board.

Solution to Problem

In order to solve the problem described above, there is provided a method for optimizing component type allocation according to the disclosure in which a plurality of component types of components are optimally allocated to an automatic feeder device which has an automatic loading function of automatically loading a component storage tape if the component storage tape in which the components are respectively stored in a plurality of component storage sections is inserted, and a manual feeder device which does not have the automatic loading function, when the automatic feeder device, the manual feeder device, and a reel holding device which rotatably holds a component supply reel around which the component storage tape is wound are installed in a plurality of installation positions which are set to be arrayed on a common pallet equipped on a component mounting machine, the method including: a workability evaluating step of evaluating a magnitude of labor in a splicing work for replenishing and connecting a new component storage tape for each component type of the component when there is no component stored in the component storage tape loaded in the manual feeder device; and an automatic side allocating step of preferentially allocating the component type having large labor in the splicing work to the automatic feeder device.

Advantageous Effects

In the method for optimizing component type allocation according to the disclosure, the magnitude of labor in the splicing work in the manual feeder device is evaluated and component type having large labor in splicing work is preferentially allocated to the automatic feeder device. Therefore, the automatic feeder device is preferentially used for the manual feeder device and the splicing work can be reduced by effectively utilizing the automatic feeder device. In addition, since the labors in the splicing work in the manual feeder devices are reduced from the large order, it is possible to contribute to the improvement of production efficiency of the board.

DESCRIPTION OF EMBODIMENTS

1. Overall Configuration of Component Mounting Machine 1

Figure 1:
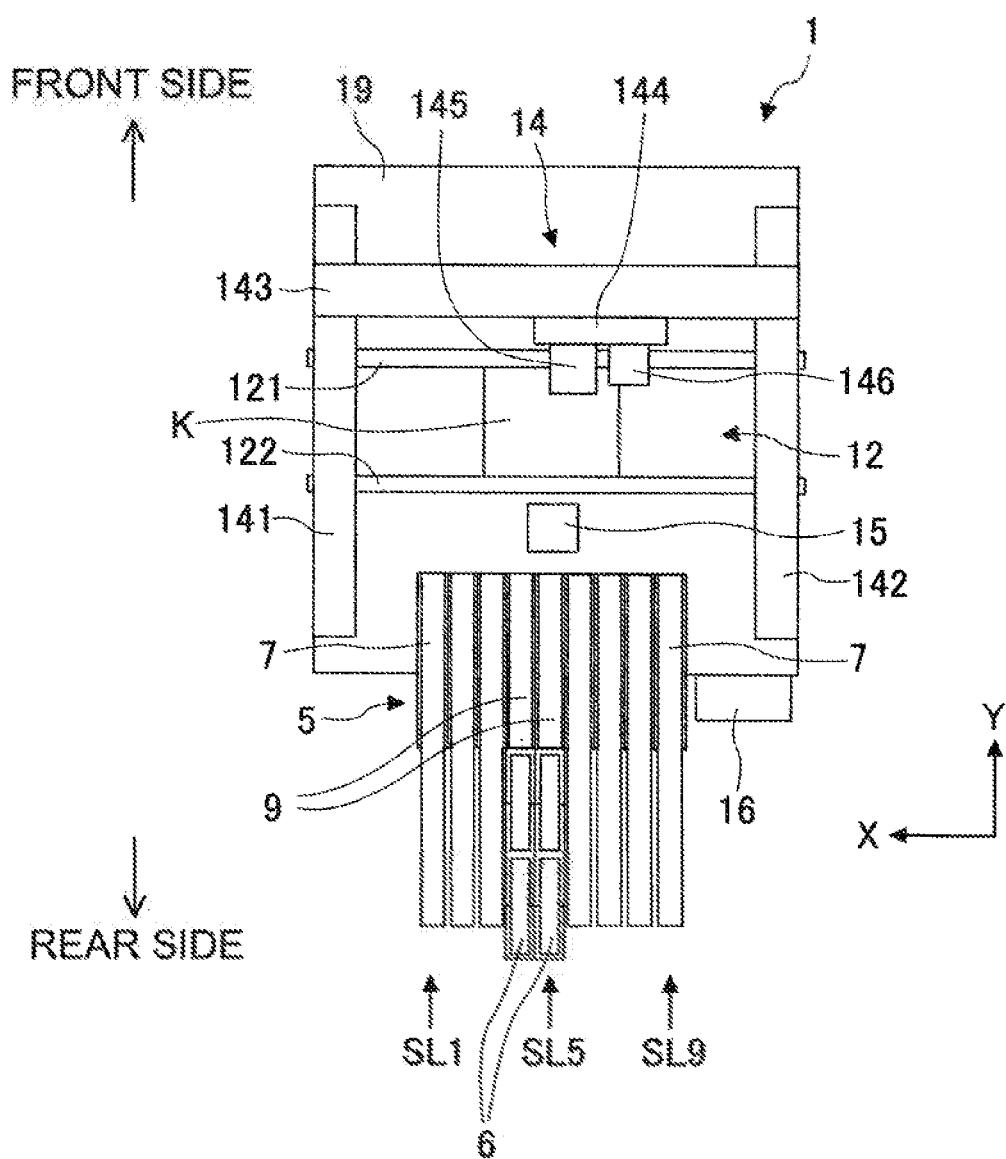
FIG. 1 is a plan view schematically illustrating an overall configuration of a component mounting machine in a simplified manner.

First, an overall configuration of a component mounting machine 1 that performs a method for optimizing component type allocation according to an embodiment of the disclosure will be described with reference to FIG. 1. FIG. 1 is a plan view schematically illustrating the overall configuration of the component mounting machine 1 in a simplified manner. A direction from the right side to the left side of the page of FIG. 1 is an X-axis direction in which the board K is carried in and out and a direction from the rear side of a lower side of the page to the front side of an upper side of the page is the Y-axis direction. The component mounting machine 1 is configured by assembling a board conveyance device 12, an attachable and detachable manual feeder device 7, an attachable and detachable automatic feeder device 9, a component transfer device 14, a component camera 15, a control device 16, or the like to a frame 19. The board conveyance device 12, the feeder devices 7, 9, the component transfer device 14, and the component camera 15 are controlled by the control device 16, and each performs a predetermined work.

The board conveyance device 12 carries in a board K to a mounting work position, positions and carries out the board K. The board conveyance device 12 is configured by a pair of first and second guide rails 121 and 122, a pair of conveyor belts, a clamping device, and the like. The first and second guide rails 121 and 122 extend in a conveyance direction (X-axis direction) across a center of an upper face of the frame 19 and are assembled to the frame 19 in parallel to each other. A pair of endless annular conveyor belts (not illustrated) is arranged in parallel on an inside of the first and second guide rails 121 and 122, facing each other. The pair of conveyor belts is rotated in a state where both edges of a board K are mounted on the conveyor conveyance surfaces, respectively, so as to carry the board K in and out the mounting work position which is set at a central section of the frame 19. The clamping device (not illustrated) is provided below the conveyor belts at the mounting work position. The clamping device pushes up a board K and clamps the board K in a horizontal posture and positions a board K at the mounting work position. Accordingly, the component transfer device 14 can perform a mounting operation at the mounting work position.

The manual feeder device 7 and the automatic feeder device 9 sequentially supply components, respectively. Each feeder device 7 and 9 has a flat shape with a small width dimension and is arrayed in first to ninth slots SL1 to SL9 of the common pallet 5 equipped on the frame 19 (to be described in detail below). In FIG. 1, the automatic feeder device 9 is installed in the fourth and fifth slots SL4 and SL5, and the manual feeder device 7 is installed in the other slots SL1 to SL3, and SL6 to SL9. A reel holding device 6 detachably attached to the common pallet 5 is disposed behind the automatic feeder devices 9. On the other hand, the reel holding device is integrally provided in the manual feeder device 7. In an actual component mounting machine, there are many cases where a greater number of feeder devices 7 and 9 are arrayed.

The component transfer device 14 sucks and picks up a component from each supply position 94 of multiple feeder devices 7 and 9, carries out the component to the positioned board K and mounts the component. The component transfer device 14 is an XY-robot type device which can horizontally move in the X-axis direction and the Y-axis direction. The component transfer device 14 is configured by a pair of Y-axis rails 141 and 142, a Y-axis slider 143, a mounting head 144, a nozzle tool 145, a board camera 146, and the like. The pair of Y-axis rails 141 and 142 is disposed near to both side faces of the frame 19 and extends in the front-back direction (Y-axis direction). On the Y-axis rails 141 and 142, a Y-axis slider 143 is mounted movably in the Y-axis direction. The Y-axis slider 143 is driven in the Y-axis direction by a Y-axis ball screw mechanism (not illustrated).

The mounting head 144 is mounted so as to be movable in the X-axis direction on the Y-axis slider 143. The mounting head 144 is driven in the X-axis direction by an X-axis ball screw mechanism (not illustrated). The nozzle tool 145 is exchangeably held on the mounting head 144. The nozzle tool 145 has one or multiple suction nozzles that suck a component and mount the component on the board K. The board camera 146 is provided on the mounting head 144 side by side with the nozzle tool 145. The board camera 146 images a fiducial mark attached to the board K and detects an accurate position of the board K.

The component camera 15 is provided upward at the center position of the upper face of the frame 19 in the width direction between the board conveyance device 12 and the feeder devices 7 and 9. While the mounting head 144 is moved from the feeder devices 7 and 9 onto the board K, the component camera 15 images the state of the component sucked by the suction nozzle. When an error in the suction posture of the component and a deviation in the rotation angle are determined by the captured image data of the component camera 15, the control device 16 finely adjusts a component mounting operation as necessary, and in a case where mounting thereof is difficult, the control for discarding the component is performed.

The control device 16 holds mounting sequence data specifying the component type, mounting position, mounting order, adaptable nozzle, and the like of components to be mounted on the board K. The control device 16 controls the component mounting operation according to the mounting sequence data based on the captured image data of the board camera 146 and the component camera 15 and detection data of a sensor (not illustrated). In addition, the control device 16 sequentially collects and updates operation condition data such as the production number of the board K of which production is completed, mounting time required for mounting the components, number of occurrences of the component suction error, and the like.

2. Configuration Examples of Automatic Feeder Device 9, Reel Holding Device 6, and Manual Feeder Device 7

Figure 2:
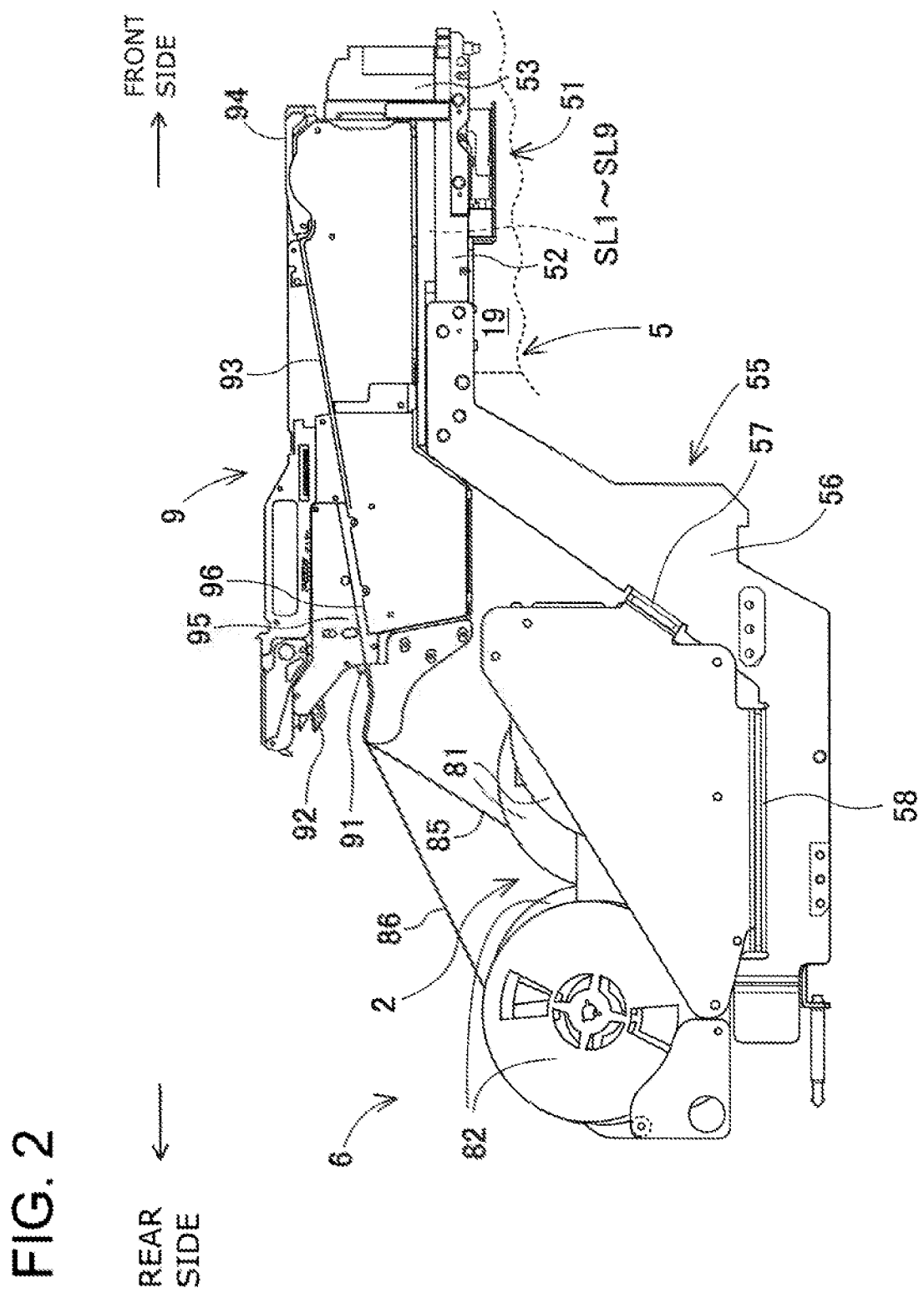
FIG. 2 is a side view illustrating a configuration example of a use state in which an automatic feeder device and a reel holding device are mounted on a common pallet.

Next, configuration examples of the automatic feeder device 9 and the reel holding device 6 will be described. FIG. 2 is a side view illustrating a configuration example of a use state in which the automatic feeder device 9 and the reel holding device 6 are mounted on the common pallet 5.

The common pallet 5 is detachably equipped on the upper side of the frame 19. The disclosure is not limited thereto, and the common pallet 5 may be fixedly equipped on the upper side of the frame 19. The common pallet 5 has a feeder mounting section 51 and a reel mounting section 55. The feeder mounting section 51 is formed by providing an upright section 53 on the front side of a substantially rectangular flat surface section 52 and has a substantially L shape in a side view. In the flat surface section 52, nine slots of first to ninth slots SL1 to SL9 extending in the front-back direction are engraved side by side in the width direction. In FIG. 1, the positions in the width direction of the first, fifth, and ninth slots SL1, SL5, SL9 are illustrated. The automatic feeder device 9 is inserted from the rear side of the slots SL1 to SL9 toward the front upright section 53 and is mounted thereon. The first to ninth slots SL1 to SL9 correspond to the installation positions where the feeder devices 7 and 9 are installed.

The automatic feeder device 9 has a tape insertion port 91 in the vicinity of the intermediate height of the rear end thereof and an insertion lever 92 near to the upper portion of the rear end thereof. By raising up of an insertion lever 92, the first and second component storage tapes 85 and 86 can be sequentially inserted into the tape insertion port 91. A feeding rail 93 is installed from the tape insertion port 91 of the automatic feeder device 9 toward the upper section of the front end. A supply position 94 is set on the upper face of the vicinity of the front end of the feeding rail 93. A standby position 96 is set on the upper face of the vicinity of the rear section near to the tape insertion port 91 of the feeding rail 93. The inserted first and second component storage tapes 85 and 86 advance to the standby position 96 and are temporarily stopped.

A tape control section 95 is provided above the standby position 96. The tape control section 95 permits to be fed from the standby position 96 of the first component storage tape 85 and causes the second component storage tape 86 to stand by. Further, when the first component storage tape 85 runs out, the tape control section 95 automatically permits to be fed from the standby position 96 of the second component storage tape 86. Therefore, a splicing work for connecting the first and second component storage tapes 85 and 86 is unnecessary. A specific configuration of the tape control section 95 is disclosed in, for example, JP-A-2014-82454.

Further, the automatic feeder device 9 includes a tape feeding mechanism (not illustrated) configured by a servomotor, a sprocket, and the like. When the first component storage tape 85 is inserted to the standby position 96, the automatic feeder device 9 drives the servomotor in the normal rotation. Accordingly, the automatic feeder device 9 automatically feeds and loads the first component storage tape 85 and preparation for production of the board K is completed. In other words, the automatic feeder device 9 has an automatic loading function. The insertion timing of the second component storage tape 86 may be immediately after the first component storage tape 85 is inserted or during the production by the first component storage tape 85.

In addition, upon receiving a discharge instruction, the automatic feeder device 9 drives the servomotor to rotate in the reverse direction. Accordingly, the automatic feeder device 9 discharges a cut tip of the loaded first or second component storage tape 85 or 86 in the direction from the supply position 94 to the tape insertion port 91. In other words, the automatic feeder device 9 has an automatic discharge function. The discharge instruction is instructed from the control device 16 or instructed by pressing a discharge button (not illustrated) attached to the automatic feeder device 9 by an operator. The automatic feeder device 9 includes a tape control section 95 and has an automatic loading function, thereby remarkably reducing the labor of a replenishment work of a new component storage tape. The applicant of the present application has already filed a detailed configuration example of the automatic feeder device 9 in the international application JP2014/064443, the international application JP2014/083619, and the like.

The reel mounting section 55 of the common pallet 5 is configured by two arm members 56, a front bridge plate 57, a rear bridge plate 58, and the like. The reel mounting section 55 is designed so that one or multiple reel holding devices 6 can be mounted. As described in detail below, two arm members 56 are fixed to rear sections on both sides in the width direction of the feeder mounting section 51, respectively. In the arm member 56, a beginning section thereof extends horizontally rearward, a subsequent section thereof extends obliquely downward and rearward, and an ending section thereof is formed to extend horizontally rearward. The front bridge plate 57 is passed so as to couple the inclined sections of the two arm members 56. A rear bridge plate 58 is passed so as to couple the rear horizontal section of the two arm members 56. The reel holding device 6 is detachably mounted on upper sides of the front bridge plate 57 and the rear bridge plate 58.

The reel holding device 6 rotatably holds the first and second component supply reels 81 and 82 side by side in the front-back direction. The size of the reel holding device 6 in the width direction (direction of reel axial line) is not limited, and one or the multiple first and second component supply reels 81 and 82 are held side by side in the width direction. Therefore, the reel holding device 6 is mounted on the rear side thereof corresponding to one or the multiple automatic feeder devices 9.

When there is no component stored in a second component storage tape 86 which is loaded in the automatic feeder device 9, the operator exchanges the reel holding device 6 disposed behind the automatic feeder device 9 or exchanges only the first or second component supply reel 81 or 82. Subsequently, the operator takes out the first and second component storage tapes 85 and 86 from the first and second component supply reels 81 and 82 and inserts the first and second component storage tapes 85 and 86 from the tape insertion port 91 of the automatic feeder device 9 to the standby position 96. This insertion work is slight compared with the splicing work for connecting the two component storage tapes 85 and 86 to each other. Accordingly, the automatic loading function of the automatic feeder device 9 can operate and the first and second component storage tapes 85 and 86 are sequentially fed to the supply position 94.

On the other hand, in the manual feeder device 7, the reel holding device is integrally provided and directly holds the component supply reel. When there is no component stored in the component storage tape loaded in the manual feeder device 7, the operator needs to perform a splicing work to replenish a new component supply reel and connect the two component storage tapes to each other. The splicing work is a troublesome work for the operator. Since the manual feeder device 7 can be constructed based on various known technologies, a detailed description thereof will be omitted.

3. Method for Optimizing Component Type Allocation in Embodiment

Figure 3:
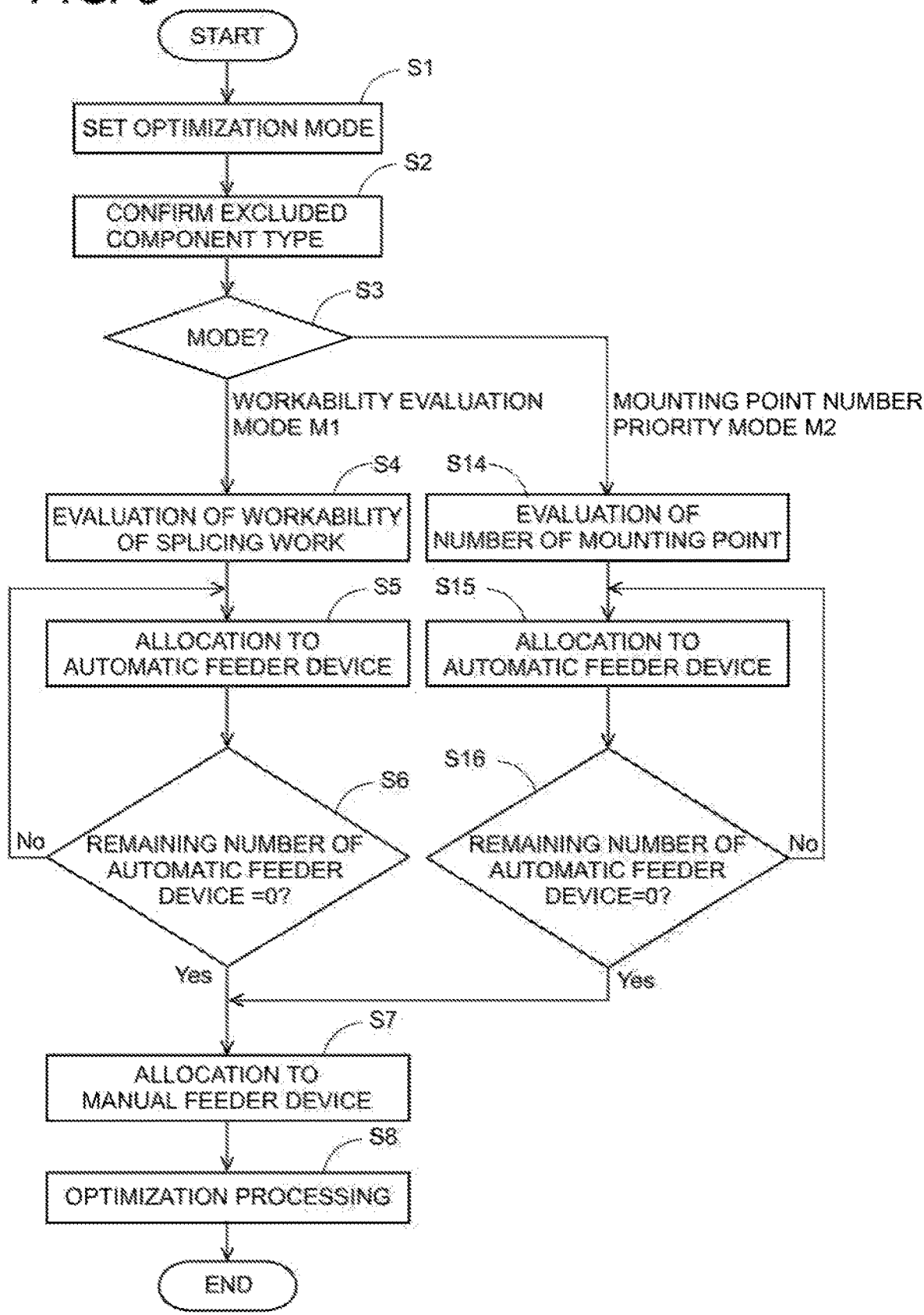
FIG. 3 is a diagram illustrating a calculation processing flow of a method for optimizing component type allocation according to an embodiment.
Figure 4:
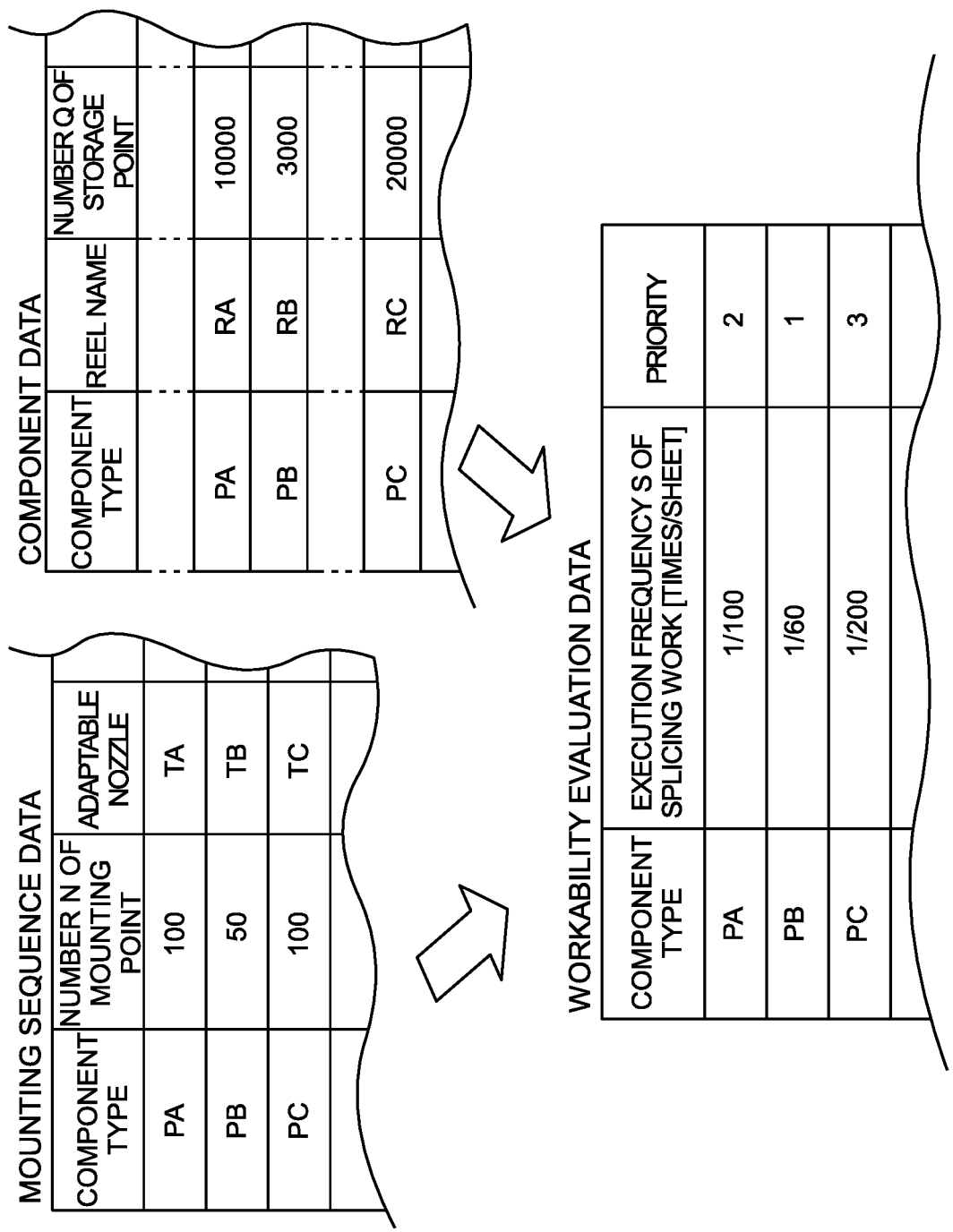
FIG. 4 is a diagram illustrating the calculation processing contents of a calculation processing flow by way of example.

Next, a method for optimizing component type allocation according to the embodiment will be described with reference to FIG. 3 and FIG. 4. The method for optimizing the component type allocation of the embodiment is realized by a calculation processing function of a control device (host computer) (not illustrated) for managing a board production line configured by including the component mounting machine 1. The disclosure is not limited thereto and the optimization method may be realized by the control device 16 of the component mounting machine 1 and a separate computer device sharing various data such as mounting sequence data. FIG. 3 is a diagram illustrating a calculation processing flow of the method for optimizing the component type allocation according to the embodiment. In addition, FIG. 4 is a diagram illustrating the calculation processing contents of the calculation processing flow by way of example.

As a precondition, a simple example is assumed in which components of four types of component types PA, PB, PC, and PD are mounted on the board K to be produced. Three types of component types PA, PB, and PC described above can be supplied from either the automatic feeder device 9 or the manual feeder device 7. The component of the component type PD corresponds to the excluded component types to be described below and can be supplied only from the manual feeder device 7. In addition, it is assumed that two automatic feeder devices 9 are prepared and a manual feeder device 7 is also prepared. In reality, more kinds of components are mounted on the board K, and in many cases, there are three or more automatic feeder devices 9.

In step S1 of FIG. 3, the control device sets an optimization mode based on an input setting operation or the like by the operator. Either the workability evaluation mode M1 or the mounting point number priority mode M2 is alternatively set to the optimization mode. The workability evaluation mode M1 is a mode in which component types are allocated based on the magnitude of labor in the splicing work. On the other hand, the mounting point number priority mode M2 is a mode in which component types are allocated based on the number N of mounting points of components to be mounted per one board K.

In step S2, the control device checks the presence or absence of an excluded component type. The excluded component type cannot be supplied from the automatic feeder device 9 due to a special shape or the like or is a component type which is preferable to be supplied from the manual feeder device 7. The control device excludes the component type D which is the excluded component type from calculation processing targets during the period from the workability evaluating step S4 to the step S6 and from the step S14 to the step S16.

In step S3, the control device controls branching of the calculation processing flow based on the set mode. In other words, if the workability evaluation mode M1 is set, the control device proceeds the execution of the calculation processing flow to the workability evaluating step S4, and if the mounting point number priority mode M2 is set, performance of the execution of the calculation processing flow proceeds to step S14.

In the workability evaluating step S4, the control device evaluates the magnitude of the labor in the splicing work. More specifically, when there is no component stored in the component storage tape loaded in the manual feeder device 7, the control device evaluates the magnitude of the labor in the splicing work for replenishing and connecting a new component storage tape for each component type. In the present embodiment, an execution frequency S of the splicing work is used as an index representing the magnitude of the labor in the splicing work. This is because when the execution frequency S is large, the number of splicing works increases and labor is required.

The control device creates the workability evaluation data in order to evaluate the execution frequency S of the splicing work. As illustrated in FIG. 4, the workability evaluation data is created based on the mounting sequence data and the component data. The mounting sequence data is data summarizing the component type, mounting position, mounting order, and the like of components to be mounted on the board K. In the mounting sequence data, the number of mounting points N of each of component types PA, PB, and PC mounted for one board K is indicated. The number of mounting points NA of the component type PA is 100, the number of mounting points NB of the component type PB is 50, and the number of mounting points NC of the component type PC is 100.

On the other hand, the component data is data which summarizes information on each component used in the component mounting machine 1. The component data includes reel names of each component type PA, PB, and PC, number of storage points Q meaning the total number of components stored in the component storage tape, shape information of the components, and the like. The number of storage points QA of the component type PA is 10000, the number of storage points QB of the component type PB is 3000, and the number of storage points QC of the component type PC is 20000.

The control device calculates the execution frequency S of the splicing work by dividing the number of mounting points N by the number of storage points Q for each component type PA, PB, and PC. A unit of the execution frequency S is (times/sheet). The execution frequency related to the component type PA is calculated as $SA=(NA/QA)=(100/10000)=(1/100)$. This means that every time 100 boards are produced, the splicing work on the component type PA is performed once. Similarly, the execution frequency related to the component type PB is calculated as $SB=(50/3000)=(1/60)$ and the execution frequency related to the component type PC is calculated as $SC=(100/20000)=(1/200)$.

Further, the control device ranks the priorities Y in the order of the execution frequency S in descending order. In other words, the priority YB of the component type PB having the maximum execution frequency SB is set to a first place, the priority YA of the component type PA having the intermediate execution frequency SA is set to a second place, and the priority YC of the component type PC having the smallest execution frequency SC is set to a third place. Accordingly, the workability evaluation data illustrated in FIG. 4 is completed.

In the next step S5, the control device preferentially allocates to the automatic feeder device 9 in order from the component type having the high priority Y. In a first execution of the step S5, the control device allocates the component type PB having the priority YB of the first place to the first automatic feeder device 9. In the next step S6, if there is a remaining number of the automatic feeder device 9 to which no component type is allocated, the control device returns the execution of the calculation processing flow to step S5, and if there is no remaining number, the execution of the calculation processing flow proceeds to step S7. In a first execution of the step S6, since the component type is not allocated to the second automatic feeder device 9, the control device returns execution of the calculation processing flow to step S5.

In a second execution of the step S5, the control device allocates the component type PA having the priority YA of the second place to the second automatic feeder device 9. In a second execution of the step S6, since there is no remaining number of the automatic feeder device 9, the control device proceeds the execution of the calculation processing flow to step S7. The loop calculation process including step S5 and step S6 corresponds to the automatic side allocation step of the disclosure.

In step S7, which exits from the loop calculation processing, the control device allocates the component type PC having the priority YC of the third place which is not yet allocated and the component type D which is the excluded component type to the manual feeder devices 7.

In addition, in step S14, which proceeds when the mounting point number priority mode M2 is set in step S3, the control device ranks the priorities Z in descending order of the number N of mounting points. In other words, the number of mounting points NA=the number of mounting points NC=100, and the priority ZA of the component type PA=a first place at the same rate and the priority ZC of the component type PC=a first place at the same rate. In addition, the number of mounting points NB=50 and it is small, and the priority ZB of the component type PB is the third place.

At the next steps S15 and S16, similarly to the workability evaluation mode M1, the control device preferentially allocates to the automatic feeder device 9 in order from the component type with the high priority Z. Specifically, the control device allocates the component type PA and the component type PC having the priority ZA=priority ZC=a first place at the same rate to the two automatic feeder devices 9. Accordingly, since there is no remaining number of the automatic feeder device 9, the control device proceeds the execution of the calculation processing flow to step S7. In step S7, the control device allocates the component type PB of the priority ZB=a third place and the component type D which is the excluded component type, which has not yet been allocated, to the manual feeder devices 7.

As described above, depending on the setting of the optimization mode, allocation results thereof may be different from each other. If the mounting point number priority mode M2 is set, the component type PB having the maximum execution frequency SB of the splicing work is allocated to the manual feeder device 7. Accordingly, the number of splicing works increases, and the production stop time due to the work increases. On the other hand, if the workability evaluation mode M1 is set, the component type PC having the minimum splicing work execution frequency SC is allocated to the manual feeder device 7, and thus the number of splicing works is minimized. Therefore, the workability evaluation mode M1 is usually superior to the mounting point number priority mode M2.

In the subsequent step S8, the control device performs optimization processing. In the optimization process, the mounting order of each component types A to D, the arrangement order of the manual feeder device 7 and the automatic feeder device 9 disposing in the first to ninth slots SL1 to SL9, and the like are optimized, and thus the mounting sequence data is updated. As a general tendency, the automatic feeder device 9, which is advantageous for reducing the splicing work, is often applied to the component type that is quickly consumed. Therefore, although the automatic feeder device 9 is often disposed in the vicinity of the center in the width direction near to the component camera 15 and the board K, this is not the case in all cases. Regarding the optimization processing, since various techniques thereof are known, a detailed description thereof will be omitted.

4. Mode and Effect of Embodiment

A method for optimizing component type allocation of an embodiment in which multiple component types of components PA to PD are optimally allocated to an automatic feeder device 9 which has an automatic loading function of automatically loading a component storage tape 85 and 86 if the component storage tape 85 and 86 in which the components are respectively stored in multiple component storage sections is inserted, and a manual feeder device 7 which does not have the automatic loading function, when the automatic feeder device 9, the manual feeder device 7, and a reel holding device 6 which rotatably holds a component supply reel 81 and 82 around which the component storage tape 85 and 86 is wound are installed in multiple installation positions (first to ninth slots SL1 to SL9) which are set to be arrayed on a common pallet 5 equipped on a component mounting machine 1, the method including: a workability evaluating step S4 of evaluating a magnitude of the labor in the splicing work for replenishing and connecting a new component storage tape for each of component type PA, PB and PC of the component when there is no component stored in the component storage tape loaded in the manual feeder device 7; and an automatic side allocating step (steps S5 and S6) of preferentially allocating the component type PB and PA having large labor in the splicing work to the automatic feeder device 9.

Accordingly, the magnitude of the labor in the splicing work in the manual feeder device 7 is evaluated and the component type having large labor in the splicing work is preferentially allocated to the automatic feeder device 9. Therefore, the automatic feeder device 9 is preferentially used for the manual feeder device 7 and the splicing work can be reduced by effectively using the automatic feeder device 9. In addition, since the labor in the splicing work in the manual feeder device 7 is reduced from the large order, the production efficiency of the board K can be improved.

Further, in the workability evaluating step S4, based on at least one item of the execution frequency S of the splicing work in the manual feeder device 7, the difficulty degree of the splicing work depending on the difference in the properties of the component storage tapes 85 and 86, and the time required for the splicing work, the magnitude of the labor in the splicing work can be evaluated.

The difficulty degree and required time can be adopted by other than the execution frequency S as an index indicating the magnitude of the labor in the splicing work. For example, the difficulty degree of the splicing work depends on the difference in materials, hardness and the like of the component storage tapes 85 and 86. In addition, difference between the embossed tape in which the component storage section is formed in a protruding shape and the flat tape with a flat surface from each other is also affected. Therefore, by preferentially allocating component type having a high difficulty degree in splicing work to the automatic feeder device 9, work reduction effect becomes remarkable.

Furthermore, two or more indices indicating the magnitude of the labor in the splicing work are also combined with each other. For example, in a case where the time required for the splicing work varies depending on the properties of the component storage tape, it is preferable to use the product of the execution frequency S and the required time. By preferentially allocating component type having a large value of the product thereof to the automatic feeder device 9, the production stop time can be minimized.

Further, in the workability evaluating step S4, the number N of mounting points for each component to be mounted per one board K is divided by the number of storage points Q of each component stored in the component storage tape 85 and 86, the execution frequency S of the splicing work is calculated respectively, and then it is evaluated that the labor in the splicing work is greater, as the execution frequency S increases. Accordingly, the execution frequency S is easily calculated by using the mounting sequence data and the component data which is created in advance for the production of the board K and the labor in the splicing work can be easily evaluated.

The method for optimizing component type allocation according to the embodiment can also be implemented as an optimization device. In other words, an apparatus for optimizing component type allocation according to the embodiment, which optimally allocates multiple component types PA to PD to an automatic feeder device 9 which has an automatic loading function of automatically loading a component storage tape 85 and 86 if the component storage tape 85 and 86 in which the components are respectively stored in multiple component storage sections is inserted, and a manual feeder device 7 which does not have the automatic loading function, when the automatic feeder device 9, the manual feeder device 7, and a reel holding device 6 which rotatably holds a component supply reel 81 and 82 around which the component storage tape 85 and 86 is wound are installed in the multiple installation positions (first to ninth slots SL1 to SL9) which are arrayed on a common pallet 5 equipped on a component mounting machine 1, the apparatus including: a workability evaluation section which evaluates the magnitude of the labor in the splicing work for replenishing and connecting a new component storage tape for each of component types PA, PB and PC of the components when there is no component stored in the component storage tape loaded in the manual feeder device 7; and an automatic side allocation section which preferentially allocates the component type having large labor in the splicing work to the automatic feeder device 9.

The operation and effect of the apparatus for optimizing component type allocation of the embodiment are the same as those of the method for optimizing component type allocation of the embodiment.

5. Application and Modification of Embodiment

In a case where the number of automatic feeder devices 9 is larger than the number of component types and there is no excluded component type, the manual feeder device 7 is not necessary. In addition, since the description of the embodiment is simplified as examples, in practice, more component types are often allocated to a larger number of automatic feeder devices 9 and manual feeder devices 7 in many cases. In addition, steps S1, S3 and S14 to S16 of the calculation processing flow illustrated in FIG. 3 may be omitted without using the mounting point number priority mode M2. Various other applications and modifications are possible with the disclosure.

REFERENCE SIGNS LIST

1: component mounting machine, 5: common pallet, 51: feeder mounting section, 55: reel mounting section, 6: reel holding device, 7: manual feeder device, 81, 82: first and second component supply reel, 85, 86: first and second component storage tape, 9: automatic feeder device, SL1 to SL9: first to ninth slot (installation position), PA, PB, and PC: component type.

What is claimed is:
1. A component mounting machine, comprising:
a clamping device which is configured to position a board;
an automatic feeder device which has an automatic loading function of automatically loading a component storage tape if the component storage tape in which components are respectively stored in multiple component storage sections is inserted;
a manual feeder which does not have the automatic loading function;
a component transfer device which is configured to pick up a component from each component storage tape loaded in the automatic feeder device and the manual feeder, to carry out the component to the board positioned by the clamping device, and to mount the component on the board; and
a control device which is configured to evaluate, for each component type, an execution frequency of a splicing work for replenishing and connecting a new component storage tape when there is no component stored in the component storage tape loaded in the manual feeder device, and to allocate to the automatic feeder device a component type having an priority value larger than other component types, the priority value based on the evaluated execution frequency for each component type.

2. The component mounting machine according to claim 1, wherein the control device is configured to evaluate the execution frequency of the splicing work based on component types to be mounted on the board, a mounting sequence data which indicates a number of mounting points of each component type to be mounted on the board, and a number of components stored in each component storage tape.

3. A board production line, comprising:
a component mounting machine on which an automatic feeder device which has an automatic loading function of automatically loading a component storage tape if the component storage tape in which components are respectively stored in multiple component storage sections is inserted, and a manual feeder which does not have the automatic loading function, are configured to be set;
a control device which is configured to evaluate, for each component type, an execution frequency of a splicing work for replenishing and connecting a new component storage tape when there is no component stored in the component storage tape loaded in the manual feeder device, and to allocate to the automatic feeder device a component type having an priority value larger than other component types, the priority value based on the evaluated execution frequency for each component type.

4. A method for allocating a plurality of component types of components to an automatic feeder device which has an automatic loading function of automatically loading a component storage tape if the component storage tape in which the components are respectively stored in a plurality component storage sections is inserted, and a manual feeder device which does not have the automatic loading function, when the automatic feeder device and the manual feeder device are set on a component mounting machine, the method comprising:
- evaluating, for each component type, an execution frequency of a splicing work for replenishing and connection a new component storage tape when there is no component stored in the component storage tape loaded in the manual feeder device; and
- allocating to the automatic feeder device a component type having an priority value larger than other component types, the priority value based on the evaluated execution frequency for each component type.

5. A method for allocating a plurality of component types of components to an automatic feeder device which has an automatic loading function of automatically loading a component storage tape if the component storage tape in which the components are respectively stored in a plurality component storage sections is inserted, and a manual feeder device which does not have the automatic loading function, when the automatic feeder device and the manual feeder device are set on a component mounting machine, the method comprising:
- evaluating, for each component type excluding an excluded component type which can be supplied only from the manual feeder device, an execution frequency of a splicing work for replenishing and connection a new component storage tape when there is no component stored in the component storage tape loaded in the manual feeder device;
- allocating to the automatic feeder device a component type having an priority value larger than other component types, the priority value based on the evaluated execution frequency for each component type; and
- allocating the excluded component type to the manual feeder device.

\* \* \* \* \*